(12) United States Patent
Sampei et al.

(10) Patent No.: US 10,406,631 B2
(45) Date of Patent: Sep. 10, 2019

(54) LASER PROCESSING APPARATUS AND LASER PROCESSING METHOD

(71) Applicant: DISCO CORPORATION, Tokyo (JP)

(72) Inventors: Takashi Sampei, Tokyo (JP); Yukiyasu Masuda, Tokyo (JP)

(73) Assignee: Disco Corporation, Tokyo (JP)

(*) Notice: Subject to any disclaimer, the term of this patent is extended or adjusted under 35 U.S.C. 154(b) by 0 days.

(21) Appl. No.: 15/988,930

(22) Filed: May 24, 2018

(65) Prior Publication Data
US 2018/0339365 A1    Nov. 29, 2018

(30) Foreign Application Priority Data

May 26, 2017 (JP) ................................ 2017-104335

(51) Int. Cl.
| | |
|---|---|
| B23K 26/08 | (2014.01) |
| H01L 21/77 | (2017.01) |
| B23K 26/067 | (2006.01) |
| B23K 26/359 | (2014.01) |
| B23K 26/364 | (2014.01) |
| B23K 103/00 | (2006.01) |
| B23K 101/40 | (2006.01) |

(52) U.S. Cl.
CPC ........ *B23K 26/0853* (2013.01); *B23K 26/067* (2013.01); *B23K 26/083* (2013.01); *B23K 26/0823* (2013.01); *B23K 26/0869* (2013.01); *B23K 26/359* (2015.10); *B23K 26/364* (2015.10); *H01L 21/77* (2013.01); *B23K 2101/40* (2018.08); *B23K 2103/56* (2018.08)

(58) Field of Classification Search
None
See application file for complete search history.

(56) References Cited

U.S. PATENT DOCUMENTS

| | | | |
|---|---|---|---|
| 2011/0011840 A1* | 1/2011 | Park | G02B 6/0038 219/121.68 |
| 2016/0067823 A1* | 3/2016 | Nomaru | B23K 26/364 219/121.77 |

FOREIGN PATENT DOCUMENTS

JP        2016132017 A    7/2016

* cited by examiner

*Primary Examiner* — Khaja Ahmad
(74) *Attorney, Agent, or Firm* — Greer Burns & Crain, Ltd.

(57) ABSTRACT

A laser processing apparatus includes a laser oscillator configured to oscillate a laser beam, a first condenser configured to focus an S-polarized laser beam, a second condenser configured to focus a P-polarized laser beam, an X-moving unit configured to processing-feed a holding table that holds a wafer thereon in X directions, and first and second indexing feed units configured to indexing-feed the first and second condensers respectively in Y directions. While the wafer is being processed with the laser beam from the first condenser along a projected dicing line on the wafer in the X directions, the second condenser is indexing-fed and positioned on a next projected dicing line along which to process the wafer.

2 Claims, 3 Drawing Sheets

LASER PROCESSING APPARATUS AND LASER PROCESSING METHOD

BACKGROUND OF THE INVENTION

Field of the Invention

The present invention relates to a laser processing apparatus and a laser processing method for processing a wafer by applying a laser beam to the wafer along a grid of projected dicing lines on the wafer.

Description of the Related Art

Laser processing apparatus process a wafer by applying a laser beam having a predetermined wavelength to the wafer along a grid of projected dicing lines on the wafer. Such a laser processing apparatus includes a chuck table for holding a wafer thereon, a condenser including a condensing lens and other optical components for converging a laser beam, and so on. While the laser beam that is condensed by the condenser is being applied to the wafer, the chuck table is processing-fed in an X direction, for example, to process the wafer on the chuck table with the laser beam along one of the projected dicing lines on the wafer. After the wafer has been processed with the laser beam along the given projected dicing line, the chuck table is index-fed in a Y direction perpendicular to the X direction to bring a next projected dicing line into alignment with the condenser, and then the laser beam is applied to the wafer to process the wafer along the next projected dicing line.

SUMMARY OF THE INVENTION

While the chuck table is being indexing-fed in the Y direction, the laser beam is not applied to the wafer and the chuck table is not processing-fed in the X direction. Therefore, the laser processing apparatus needs to wait during a period of time in which no laser processing process is performed, i.e., a standby time. The standby time is liable to adversely affect the throughput of the laser processing apparatus.

It is therefore an object of the present invention to provide a laser processing apparatus and a laser processing method which are capable of shortening a standby time for a higher processing efficiency.

In accordance with an aspect of the present invention, there is provided a laser processing apparatus configured to process a wafer with a laser beam which is applied to the wafer along a plurality of projected dicing lines on a surface thereof which demarcate the surface into a plurality of areas with devices formed therein, including a holding table having a holding surface configured to hold the wafer thereon, processing means for processing the wafer held on the holding table with the laser beam which is focused at a processing point along the projected dicing lines, and X-moving means for moving the holding table in X-directions which are directions along which the projected dicing lines extend. The processing means includes a laser oscillator configured to oscillate the laser beam, a first condenser and a second condenser juxtaposed in Y directions perpendicular to the X directions over the holding surface and disposed in order of arrival of the laser beam from the laser oscillator, and switching means disposed on the optical path of the laser beam from the laser oscillator in the Y directions and arranged to switch between a mode configured to focus the laser beam from the laser oscillator with the first condenser and a mode configured to focus the laser beam from the laser oscillator with the second condenser. The switching means includes a ½ wavelength plate, rotating means for turning the ½ wavelength plate selectively to a first angle and a second angle, a polarizing beam splitter configured to reflect 100% an S-polarized laser beam whose plane of polarization has been rotated by the ½ wavelength plate that has been turned to the first angle and whose optical path extends along the Y directions, to travel along an optical path in Z directions perpendicular to the X directions and the Y directions to the first condenser, so that the S-polarized laser beam is focused by the first condenser, and a mirror configured to reflect a P-polarized laser beam which has been transmitted 100% through the polarizing beam splitter, and whose plane of polarization has been rotated by the ½ wavelength plate that has been turned to the second angle and whose optical path extends along the Y directions, to travel along an optical path in the Z directions to the second condenser, so that the P-polarized laser beam is focused by the second condenser. The laser processing apparatus further includes first indexing feed means for indexing-feeding the polarizing beam splitter and the first condenser in one of the Y directions, second indexing feed means for indexing-feeding the mirror and the second condenser in one of the Y directions, and control means. While the wafer is being processed with the laser beam from either one of the first condenser and the second condenser, the control means operates one of the first indexing feed means and the second indexing feed means to indexing-feed the other of the first condenser and the second condenser to a next one of the projected dicing lines to be processed.

With this arrangement, while the wafer is being processed with the laser beam focused by the first condenser along a given one of the projected dicing lines, the second condenser can be indexing-fed and positioned on a next one of the projected dicing lines. Therefore, immediately after the wafer has been processed with the laser beam along the given one of the projected dicing lines, the wafer can be processed with the laser beam along the next one of the projected dicing lines with the laser beam focused by the second condenser. Furthermore, while the wafer is being processed with the laser beam focused by the second condenser along the next one of the projected dicing lines, the first condenser can be indexing-fed and positioned on one after the next one of the projected dicing lines. Since while the laser beam from either one of the two condensers is processing the wafer along a given projected dicing line thereon, the other of the condensers can be indexing-fed and positioned on a next projected dicing line, the standby time of the laser processing apparatus in which no laser processing process is performed is reduced, allowing laser processing sessions to be successively performed on the wafer for a higher efficiency with which to process the wafer.

In accordance with another aspect of the present invention, there is provided a laser processing method of processing a wafer with a laser beam using the above laser processing apparatus, including a holding step of holding the wafer with the projected dicing lines on a holding table, an alignment step of detecting the projected dicing lines on the wafer held in the holding step, a first processing step of positioning a processing point of the first condenser which has focused the laser beam from the laser oscillator, on one of the projected dicing lines, and moving the holding table in a +X direction to process the wafer with the laser beam, a first indexing feed step of positioning a processing point of the second condenser on a next one of the projected dicing line to be processed during the first processing step, after the first indexing feed step, a second processing step of moving the holding table in a −X direction which is opposite to the +X direction in the first processing step to process the wafer with the laser beam at the processing point of the second condenser, a second indexing feed step of positioning the processing point of the first condenser on a next one of the projected dicing line to be processed during the second processing step, and a repeating step of repeating the first processing step, the first indexing feed step, the second processing step, and the second indexing feed step.

According to the present invention, the standby time while the wafer is being processed with the laser beam can be shortened for a higher processing efficiency.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
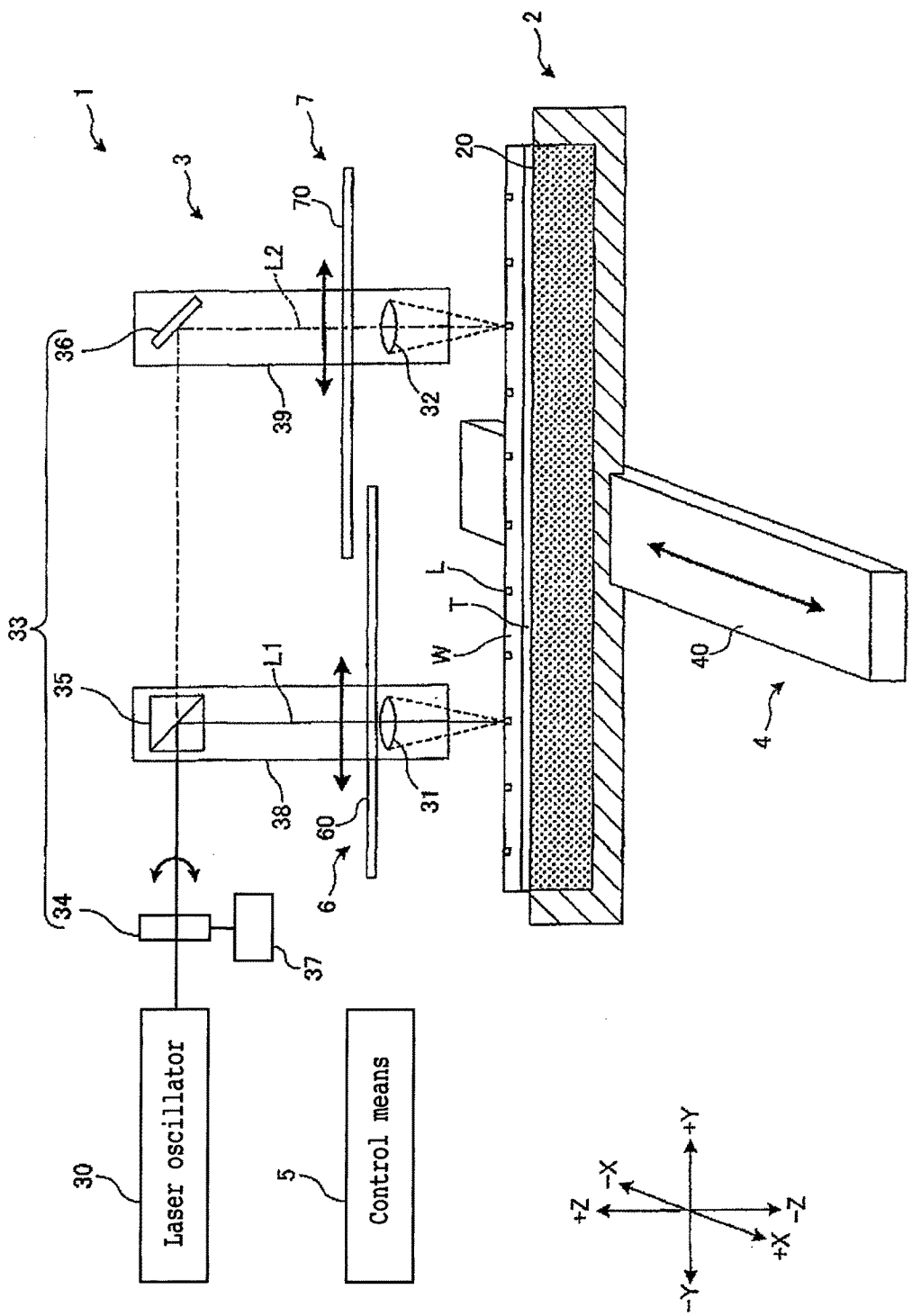
FIG. 1 is a schematic view of a laser processing apparatus according to an embodiment of the present invention.

A laser processing apparatus according to an embodiment of the present invention will hereinafter be described below with reference to the accompanying drawings. FIG. 1 is a schematic view of a laser processing apparatus according to an embodiment of the present invention. In the laser processing apparatus according to the present embodiment, X directions will also be referred to as processing feed directions, Y directions as indexing feed directions, and Z directions as laser beam applying directions, and the X directions, the Y directions, and the Z directions are orthogonal to each other. In FIGS. 1 through 5, one of the X directions which is oriented toward the viewer will also be referred to as a +X direction and the other away from the viewer as a −X direction, one of the Y directions toward the right as a +Y direction and the other toward the left as a −Y direction, and one of the Z directions which is oriented upwardly as a +Z direction and the other downwardly as a −Z direction.

As depicted in FIG. 1, the laser processing apparatus, denoted by 1, is arranged to process a wafer W by applying a laser beam having a predetermined wavelength to the wafer W. Specifically, the laser processing apparatus 1 includes a holding table 2 for holding a wafer W thereon, processing means 3 for applying a laser beam to the wafer W on the holding table 2, X-moving means 4 for moving the holding table 2 and the processing means 3 relatively to each other in the X directions, and control means 5 for controlling the holding table 2, the processing means 3, and the X-moving means 4.

The wafer W is of a circular shape and has a grid of projected dicing lines or streets L formed on a face side thereof. The projected dicing lines L demarcate the face side of the wafer W into a plurality of areas with devices, not depicted, formed therein. The wafer W is not limited to any specific types, but may be a semiconductor wafer, an optical device wafer, or the like.

The holding table 2 includes a porous chuck for holding the wafer W under suction thereon and has a holding surface 20 as an upper surface of a frame in the form of a circular plate. The holding surface 20 is made of a porous material such as ceramics or the like. The holding surface 20 is of a circular shape having substantially the same diameter as the wafer W, and is capable of holding the wafer W under suction thereon by a vacuum developed on the holding surface 20. The wafer W is held under suction on the holding surface 20 with a tape T interposed therebetween, as described in detail later. The X-moving means 4 includes a guide actuator driven by an electric motor, for example, and moves the holding table 2 in the +X direction and the −X direction along a guide rail 40 that extends in the X directions.

The processing means 3 positions a processing point where a laser beam is focused, which may also be referred to as a focused point, on the wafer W along a projected dicing line L, and processes the wafer W with the laser beam along the projected dicing line L. Specifically, the processing means 3 includes a laser oscillator 30 for oscillating a laser beam, two condensers 31 and 32 serving as part of an optical system for focusing a laser beam from the laser oscillator 30, and switching means 33 as part of the optical system for switching (polarized components of) the laser beam to be focused by the condensers 31 and 32.

The laser oscillator 30 includes a laser beam source capable of emitting a laser beam having a predetermined wavelength in the +Y direction. The wavelength of the laser beam is not limited to any particular value, but may be changed depending on the material of the wafer W and the way in which the wafer W is processed.

The condensers 31 and 32 include convex lenses that serve as part of the optical system of the processing means 3. The condensers 31 and 32 are juxtaposed along the Y directions and have respective optical axes extending along the Z directions. For illustrative purposes, the condenser 31 that is disposed closer to the laser oscillator 30 will also be referred to as a first condenser, and the condenser 32 that is disposed farther from the laser oscillator 30 as a second condenser. In other words, the first condenser and the second condenser are disposed in order of arrival of the laser beam from the laser oscillator 30.

The switching means 33 is an optical system that is disposed on the optical path of the laser beam emitted from the laser oscillator 30 in the +Y direction, and is arranged to switch between a mode for focusing the laser beam emitted from the laser oscillator 30 with the condenser 31 and a mode for focusing the laser beam emitted from the laser oscillator 30 with the condenser 32. Specifically, the switching means 33 includes a ½ wavelength plate 34, a polarizing beam splitter 35, and a mirror 36 that are disposed successively in the order named from the laser oscillator 30 side.

The ½ wavelength plate 34 serves to change the polarized state (plane of polarization) of the laser beam from the laser oscillator 30. Specifically, the ½ wavelength plate 34 is coupled to rotating means 37, which turns the ½ wavelength plate 34 to adjust the angle thereof with respect to the laser beam from the laser oscillator 30. When the linearly polarized laser beam emitted from the laser oscillator 30 passes through the ½ wavelength plate 34 that is held at a predetermined angle, the laser beam has its plane of polarization rotated, adjusting the ratio of two perpendicular polarized components (S-polarized and P-polarized components) thereof. As described in detail later, the rotating means 37 is arranged to turn the ½ wavelength plate 34 selectively to a first angle and a second angle. When the ½ wavelength plate 34 is at the first angle, it adjusts the ratio of the S-polarized component to 100%, and when the ½ wavelength plate 34 is at the second angle, it adjusts the ratio of the P-polarized component to 100%.

The polarizing beam splitter 35 is disposed between the ½ wavelength plate 34 and the mirror 36 on the optical path of the laser beam emitted from the laser oscillator 30 in the +Y direction. Specifically, the polarizing beam splitter 35 is disposed at a position where the optical path of the laser beam emitted from the laser oscillator 30 in the +Y direction and the optical axis of the condenser 31 intersect with each other at a right angle.

The polarizing beam splitter 35 reflects the S-polarized component (hereinafter also referred to as a first laser beam L1) that has passed through the ½ wavelength plate 34 toward the condenser 31, and transmits the P-polarized component (hereinafter also referred to as a second laser beam L2) that has passed through the ½ wavelength plate 34 therethrough toward the mirror 36. As described in detail later, the S-polarized component whose optical path has changed from the +Y direction to the −Z direction by the polarizing beam splitter 35 is focused by the condenser 31 and applied to the wafer W.

The mirror 36 is disposed at a position where the optical path of the laser beam emitted from the laser oscillator 30 in the +Y direction and the optical axis of the condenser 32 intersect with each other at a right angle. The mirror 36 reflects the P-polarized component that has passed through the polarizing beam splitter 35 toward the condenser 32. As described in detail later, the P-polarized component whose optical path has changed from the +Y direction to the −Z direction by the mirror 36 is focused by the condenser 31 and applied to the wafer W.

The condenser 31 and the polarizing beam splitter 35 are housed together in a casing 38, and movable in the Y directions by first indexing feed means 6. The first indexing feed means 6 includes a guide actuator driven by an electric motor, for example, and indexing-feeds the condenser 31 and the polarizing beam splitter 35 in the +Y direction or the −Y direction along a guide rail 60 that extends in the Y directions.

Similarly, the condenser 32 and the mirror 36 are housed together in a casing 39, and movable in the Y directions by second indexing feed means 7. The second indexing feed means 7 includes a guide actuator driven by an electric motor, for example, and indexing-feeds the condenser 32 and the mirror 36 in the +Y direction or the −Y direction along a guide rail 70 that extends in the Y directions.

The control means 5 includes a processor for carrying out various processing operations, a memory, and so on. The memory includes one or more storage mediums such as a read only memory (ROM), a random access memory (RAM), etc. depending on how the memory is used. The memory stores control programs for controlling various parts of the laser processing apparatus 1, and a processing program for carrying out an image processing process to be described later, for example. The control means 5 controls operation of the X-moving means 4, the laser oscillator 30, the rotating means 37, the first and second indexing feed means 6 and 7, for example.

Generally, a laser processing apparatus moves a holding table that holds a wafer thereon in a predetermined direction, e.g., an X direction as a processing feed direction, along a projected dicing line on the wafer with respect to processing means that applies a laser beam to the surface of the wafer. After the holding table has been moved from one end to the other of the projected dicing line with respect to the processing means, the holding table is indexing-fed in a direction different from the processing feed direction, e.g., a Y direction perpendicular to the X direction, until the processing means 3 has its processing position or processing point positioned in alignment with a next projected dicing line. Then, the processing means applies a laser beam to the surface of the wafer again while at the same time the holding table is moved back from the other end to the one end of the next projected dicing line along the X direction. The above cycle is repeated to process the laser beam along all the projected dicing lines on the wafer.

In other words, the laser processing apparatus processes the wafer with a laser beam in the +X direction, then indexing-feeds the holding table in the +Y direction or the −Y direction, and thereafter processes the wafer with a laser beam in the −X direction. Thereafter, the laser processing apparatus indexing-feeds the holding table in the +Y direction or the −Y direction. The wafer is thus processed while it is being reciprocally moved repeatedly in the X directions. While the holding table is being indexing-fed in the +Y direction or the −Y direction, no laser beam is applied to the wafer and the wafer is not processing-fed in the +X direction or the −X direction. Therefore, the laser processing apparatus needs to wait during a period of time in which no laser processing process is performed, i.e., a standby time. The standby time is liable to adversely affect the throughput of the laser processing apparatus.

When the holding table moves in each of the X directions, it operates basically in three different phases, an accelerating phase in which the holding table starts to move, a constant-speed phase in which the holding table moves at a stable speed, and a decelerating phase in which the holding table comes to a stop after the wafer has been processed with the laser beam. In order to control the quality of the processing of the wafer uniformly, the wafer should preferably be processed with the laser beam while the holding table is operating in the constant-speed phase. Therefore, the accelerating phase needs to be completed and the decelerating phase need to be started when the processing point is positioned off the wafer.

In view of the different speeds at which the holding table moves, there has been proposed a laser processing apparatus that indexing-feeds a holding table while the holding table is operating in the accelerating phase and the decelerating phase. The proposed laser processing apparatus purports to shorten a processing time by indexing-feeding the holding table while the holding table is operating in the accelerating phase and the decelerating phase.

However, if the distance that the holding table is indexing-fed is large because the interval between two adjacent projected dicing lines is large or if the time required for the holding table to operate in the accelerating phase and the decelerating phase is short, then it may be difficult to complete the indexing-feeding of the holding table while the holding table is operating in the accelerating phase and the decelerating phase, and a standby time may not be sufficiently shortened.

The inventor of the present invention has conceived the laser processing apparatus 1 which is capable of shortening a standby time for a higher processing efficiency regardless of the distance that the holding table is indexing-fed and the time required for the holding table to operate in the accelerating phase and the decelerating phase. According to the present embodiment, the laser processing apparatus 1 includes the two condensers 31 and 32 (first and second condensers) as part of the optical system for focusing the laser beam from the laser oscillator 30, and the switching means 33 as part of the optical system for switching the laser beam from the laser oscillator 30 selectively to the condensers 31 and 32. The laser processing apparatus 1 also includes the first and second indexing feed means 6 and 7 for indexing-feeding the respective condensers 31 and 32 independently of each other.

While the laser beam from either one of the condensers 31 and 32 is processing the wafer W along a given projected dicing line L thereon, the control means 5 for controlling the laser processing apparatus 1 actuates one of the first and second indexing feed means 6 and 7 which is associated with the other of the condensers 31 and 32 to indexing-feed the other condenser 31 or 32 to a next projected dicing line L along which to process the wafer W.

Specifically, while the laser beam focused by the condenser 31, for example, is processing the wafer W along a given projected dicing line L thereon, the condenser 32 can be indexing-fed and positioned on a next projected dicing line L on the wafer W. Therefore, immediately after the wafer W has been processed by the laser beam focused by the condenser 31 along the given projected dicing line L, the wafer W can be processed by the laser beam focused by the condenser 32 along the next projected dicing line L. Furthermore, while the laser beam focused by the condenser 32 is processing the wafer W along the next projected dicing line L thereon, the condenser 31 can be indexing-fed and positioned on one after the next projected dicing line L on the wafer W.

As described above, since while the laser beam from either one of the condensers 31 and 32 is processing the wafer W along a given projected dicing line L thereon, the other of the condensers 31 and 32 can be indexing-fed and positioned on a next projected dicing line L, the standby time of the laser processing apparatus 1 in which no laser processing process is performed is reduced, allowing laser processing sessions to be successively performed on the wafer W for a higher efficiency with which to process the wafer W.

Figure 2:
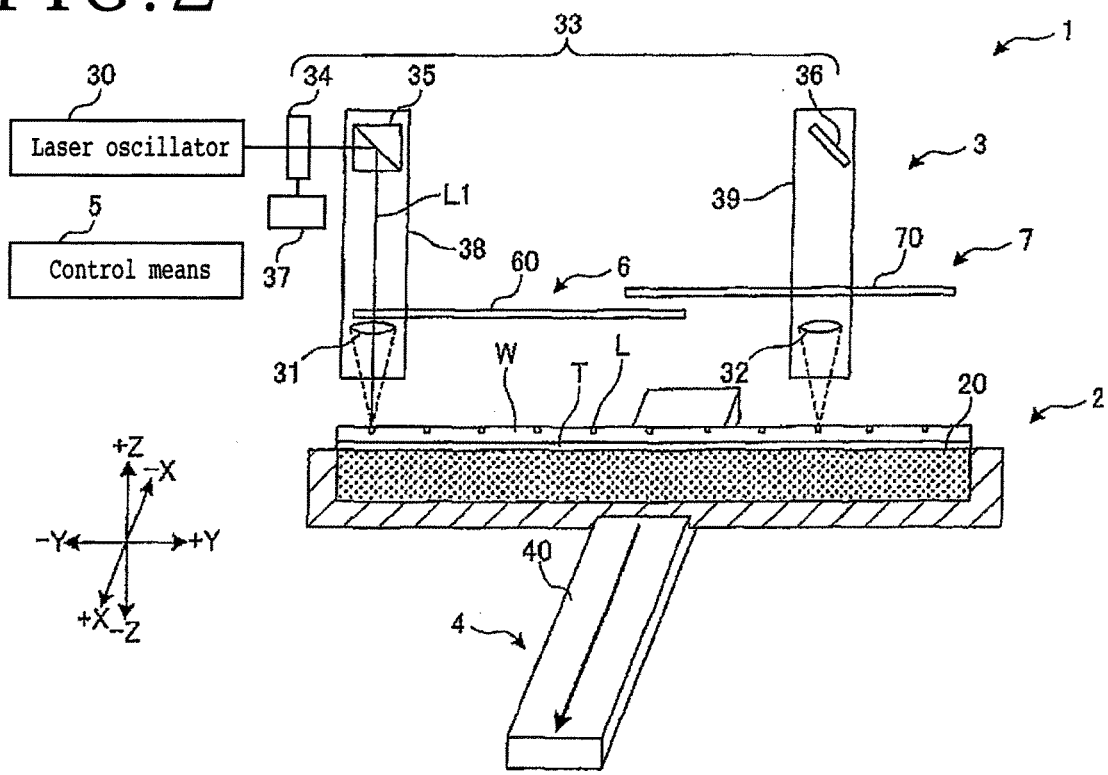
FIG. 2 is a schematic view depicting by way of example a first processing step carried out by the laser processing apparatus according to the embodiment.
Figure 3:
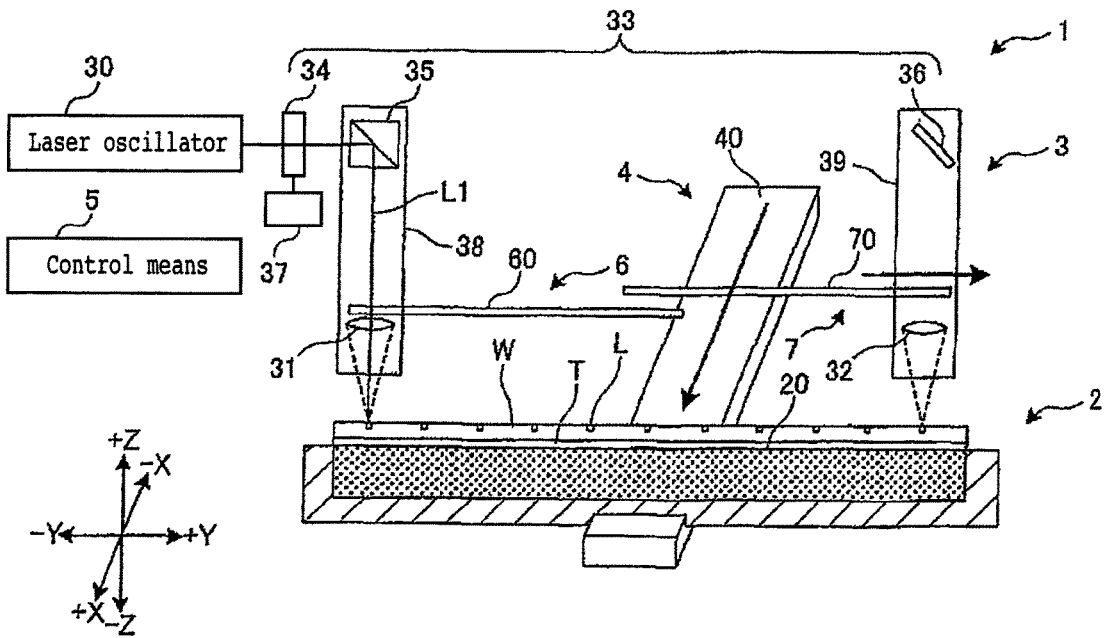
FIG. 3 is a schematic view depicting by way of example a first indexing feed step carried out by the laser processing apparatus according to the embodiment.
Figure 4:
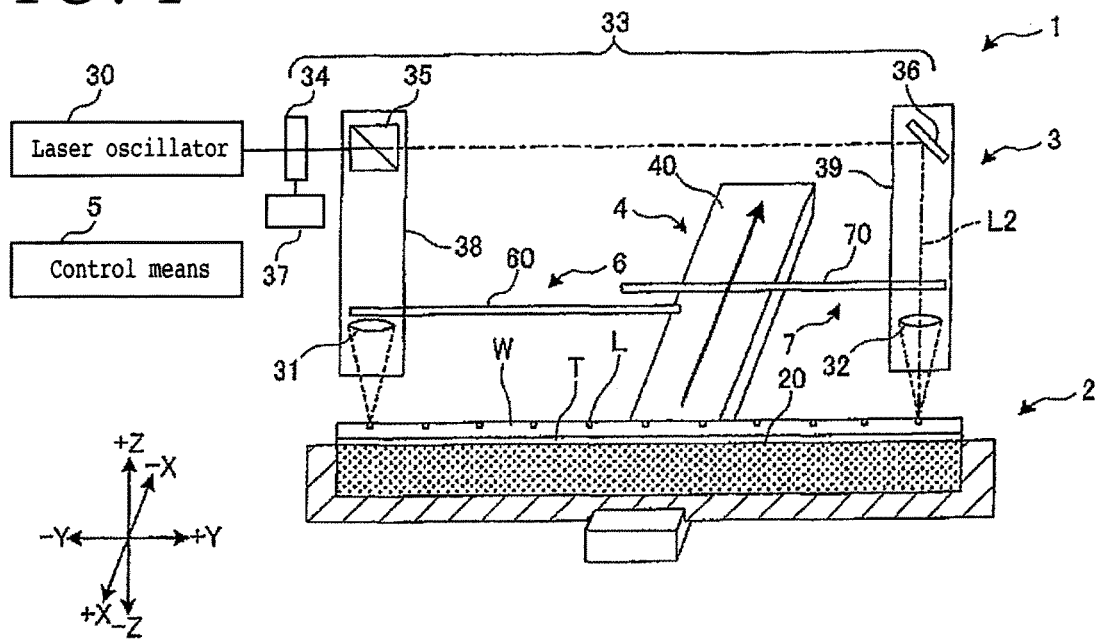
FIG. 4 is a schematic view depicting by way of example a second processing step carried out by the laser processing apparatus according to the embodiment.
Figure 5:
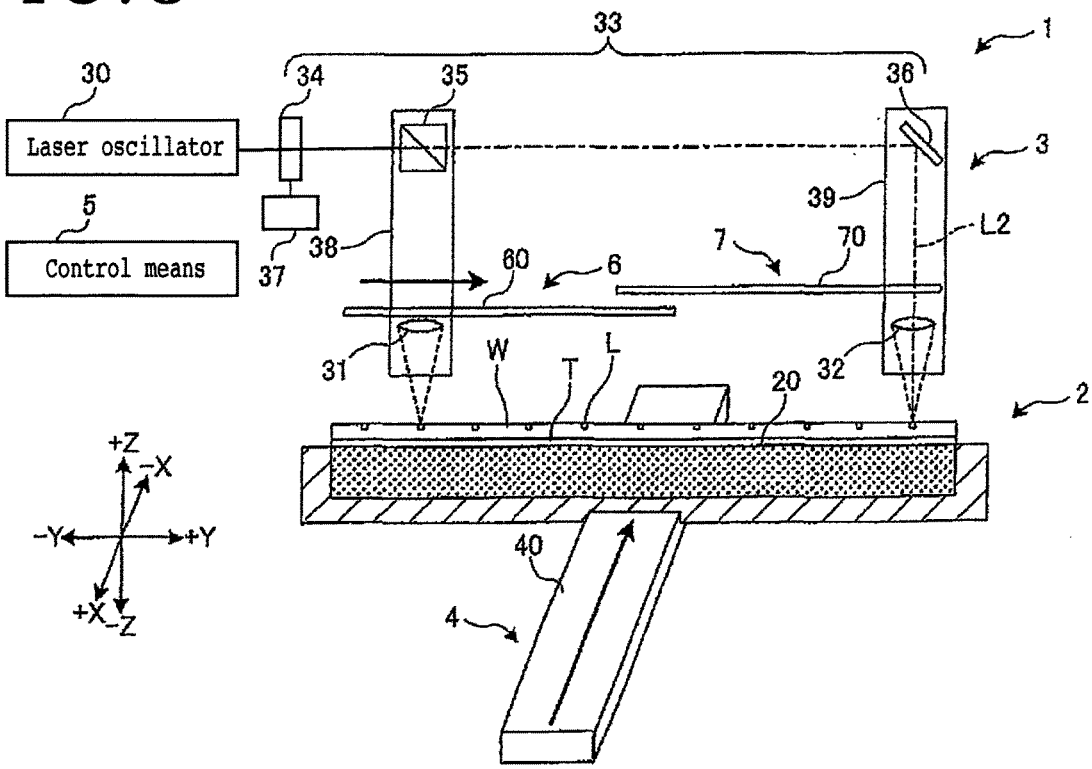
FIG. 5 is a schematic view depicting by way of example a second indexing feed step carried out by the laser processing apparatus according to the embodiment.

Operation of the laser processing apparatus according to the present embodiment, i.e., a laser processing method according to the present embodiment, will be described below with reference to FIGS. 1 through 5. FIG. 2 is a schematic view depicting by way of example a first processing step carried out by the laser processing apparatus 1 according to the embodiment. FIG. 3 is a schematic view depicting by way of example a first indexing feed step carried out by the laser processing apparatus 1 according to the embodiment. FIG. 4 is a schematic view depicting by way of example a second processing step carried out by the laser processing apparatus 1 according to the embodiment. FIG. 5 is a schematic view depicting by way of example a second indexing feed step carried out by the laser processing apparatus 1 according to the embodiment.

The laser processing method according to the present embodiment includes a holding step, an alignment step, a first processing step (see FIG. 2), a first indexing feed step (see FIG. 3), a second processing step (see FIG. 4), a second indexing feed step (see FIG. 5), and a repeating step which are carried out in the order named.

As depicted in FIG. 1, the wafer W with the tape T stuck to its lower surface is placed on the holding surface 20 of the holding table 2 such that the center of the holding surface 20 and the center of the wafer W are aligned with each other in the holding step. The wafer W is held through the tape T under suction on the holding table 2 by a vacuum or negative pressure developed on the holding surface 20.

Then, the alignment step is carried out. In the alignment step, image capturing means, not depicted, captures an image of the entire face side of the wafer W on the holding surface 20, detecting all the projected dicing lines L on the face side of the wafer W. The control means 5 detects processing areas, i.e., projected dicing lines L, on the wafer W on the basis of the image captured by the image capturing means, and positions respective processing points of the condensers 31 and 32 in alignment with the detected processing areas.

Specifically, the control means 5 detects the widths of the projected dicing lines L from the captured image and adjusts the positions of the condensers 31 and 32 with respect to the holding table 2 in the Y directions such that the centers of the projected dicing lines L across their widths and the processing points are aligned with each other. More specifically, the condenser 31 and the polarizing beam splitter 35 are positioned to place the processing point thereof on a first projected dicing line L on the end of the wafer W in the −Y direction, and the condenser 32 and the mirror 36 are positioned to place the processing point thereof on a certain projected dicing line L that is spaced from the first projected dicing line L in the +Y direction (see FIG. 2). The holding table 2 has been positioned at the end of the guide rail 40 in the −X direction. The laser processing apparatus 1 is now ready for processing the wafer W with a laser beam.

Then, the first processing step is carried out. In the first processing step, as depicted in FIG. 2, the processing point of the condenser 31 that has focused the laser beam (first laser beam L1) emitted from the laser oscillator 30 is positioned on the projected dicing line L, and the holding table 2 is moved in the +X direction to process the wafer W with the laser beam.

Specifically, the ½ wavelength plate 34 has angularly been adjusted to the first angle by the rotating means 37. The laser beam emitted from the laser oscillator 30 passes through the ½ wavelength plate 34, which adjusts the ratio of the S-polarized component to 100%, and is applied as the first laser beam L1 to the polarizing beam splitter 35. The first laser beam L1 is reflected 100% by the polarizing beam splitter 35, and has its optical path changed from the +Y direction to the −Z direction before reaching the condenser 31. The first laser beam L1 passes through the condenser 31 and is focused thereby onto the processing point on the projected dicing line L. While the first laser beam L1 is being applied to the projected dicing line L, the holding table 2 is moved in the +X direction along the guide rail 40. The wafer W is thus processed with the first laser beam L1 along the projected dicing line L.

Next, the first indexing feed step will be described below. The first indexing feed step is carried out during the first processing step described above. Specifically, in the first indexing feed step, as depicted in FIG. 3, while the holding table 2 is moving in the +X direction along the guide rail 40, the condenser 32 and the mirror 36 are moved in the +Y direction along the guide rail 70 by the second indexing feed means 7. The condenser 31 and the mirror 36 are moved until the processing point thereof is positioned on the projected dicing line L on the end of the wafer W in the +Y direction.

The condenser 32 and the mirror 36 should preferably be fully moved by the time the first processing step is finished, i.e., by the time the holding table 2 is positioned on the end of the guide rail 40 in the +X direction. By thus positioning the condenser 32 at a next processing position while the condenser 31 is applying the laser beam, it is possible to shorten the standby type of the laser processing apparatus 1.

When the first indexing feed step and the first processing step are completed, then the second processing step is carried out. In the second processing step, as depicted in FIG. 4, the holding table 2 is moved in the −X direction, which is opposite the +X direction in the first processing step, processing the wafer W with the laser beam at the processing point of the condenser 32. As described above, when the first processing step is completed as a result of focusing the laser beam on the projected dicing line L with the condenser 31 and moving the holding table 2 to the end of the guide rail 40 in the +X direction, the condenser 32 has already been positioned on the next projected dicing line L. Consequently, the laser processing apparatus 1 can immediately initiate the second processing step.

At this time, the ½ wavelength plate 34 has angularly been adjusted to the second angle by the rotating means 37. The laser beam emitted from the laser oscillator 30 passes through the ½ wavelength plate 34, which adjusts the ratio of the P-polarized component to 100%, and is applied as the second laser beam L2 to the polarizing beam splitter 35. The second laser beam L2 passes through the polarizing beam splitter 35 and reaches the mirror 36. The mirror 36 changes the optical path of the second laser beam L2 from the +Y direction to the −Z direction before reaching the condenser 32. The second laser beam L2 passes through the condenser 32 and is focused thereby onto the processing point on the next projected dicing line L. While the second laser beam L2 is being applied to the next projected dicing line L, the holding table 2 is moved in the −X direction along the guide rail 40. The wafer W is thus processed with the second laser beam L2 along the next projected dicing line L.

Next, the second indexing feed step will be described below. The second indexing feed step is carried out during the second processing step described above. Specifically, in the second indexing feed step, as depicted in FIG. 5, while the holding table 2 is moving in the −X direction along the guide rail 40, the condenser 31 and the polarizing beam splitter 35 are moved in the +Y direction along the guide rail 60 by the first indexing feed means 6. The condenser 31 and the polarizing beam splitter 35 are moved until the processing point thereof is positioned on a next projected dicing line L adjacent to the projected dicing line L along which the wafer W was processed in the first processing step.

The condenser 31 and the polarizing beam splitter 35 should preferably be fully moved by the time the second processing step is finished, i.e., by the time the holding table 2 is positioned on the end of the guide rail 40 in the −X direction. By thus positioning the condenser 31 at a next processing position while the condenser 32 is applying the laser beam, it is possible to shorten the standby time of the laser processing apparatus 1.

After completion of the second indexing feed step and the second processing step, a repeating step is carried out to repeat the first processing step, the first indexing feed step, the second processing step, and the second indexing feed step described above. When the two condensers 31 and 32 alternately apply the laser beam to the projected dicing lines L successively in the +Y and −Y directions from outside of the wafer W, the wafer W can be processed with the laser beam along all the projected dicing lines L thereon that are arranged from outside of the wafer W toward the center thereof. In the vicinity of the center of the wafer W, either one of the condensers 31 and 32 may successively perform the first processing step or the second processing step insofar as the condensers 31 and 32 do not physically interfere with each other.

According to the present embodiment, as described above, while the wafer W is being processed with the laser beam from either one of the two condensers 31 and 32, the other of the two condensers 31 and 32 is indexing-fed to a next projected dicing line, so that the laser processing apparatus 1 can process the wafer W in successive laser processing sessions while shortening the standby time for a higher efficiency with which to process the wafer W. The laser processing apparatus 1 can be constructed on existing structures without requiring complex optical systems and actuating mechanisms.

In the above embodiment, the single laser processing apparatus has been illustrated. However, the present invention is not limited such an arrangement. The principles of the present invention are also applicable to other processing apparatus having processing means for performing laser processing operations. For example, the present invention may be applied to a cluster system including a grinding apparatus, a polishing apparatus, a plasma etching apparatus, an edge trimming apparatus, an expanding apparatus, a braking apparatus, and so on.

Workpieces to be processed may be a wide variety of workpieces, e.g., a semiconductor device wafer, an optical device wafer, a package board, a semiconductor board, an inorganic material board, an oxide wafer, a raw ceramic board, and a piezoelectric board, etc. The semiconductor device wafer may include a silicon wafer or a compound semiconductor wafer with devices formed thereon. The optical device wafer may include a sapphire wafer or a silicon carbide wafer with devices formed thereon. The package board may include a chip size package (CSP) board. The semiconductor board may include a board made of silicon, gallium arsenide, or the like. The inorganic material board may include a board made of sapphire, ceramics, glass, or the like. The oxide wafer may include a wafer made of lithium tantalate, lithium niobate, or the like with or without devices thereon.

In the above embodiment, a laser beam having a predetermined wavelength is applied to the wafer W. However, the wavelength of a laser beam applied to the wafer W may be varied. The present invention is also applicable to an ablation process in which a laser beam having a wavelength that is absorbable by the wafer W is applied to the wafer W to process the wafer, and a stealth dicing process in which a laser beam having a wavelength that is transmittable through the wafer W is applied to the wafer W to process the wafer.

In the above embodiment, an image of the entire face side of the wafer W is captured to detect all the projected dicing lines L on the face side of the wafer W in the alignment step. However, the present invention is not limited to such an arrangement. The alignment step may be carried out by detecting one projected dicing line L for each line. In this case, the laser processing apparatus 1 should preferably include a first microscope, not depicted, combined with the first condenser 31, and a second microscope, not depicted, combined with the second condenser 32. While the wafer W is being processed with the laser beam from the first condenser 31, the second condenser 32 is indexing-fed by the second indexing feed means 7, and the second microscope may be used to confirm whether or not the second condenser 32 that has been indexing-fed is accurately positioned on a projected dicing line L to be processed. If the second condenser 32 that has been indexing-fed is positioned off a projected dicing line L to be processed, then the laser processing apparatus 1 may correct the position of the second condenser 32. Furthermore, while the wafer W is being processed with the laser beam from the second condenser 32, the first condenser 31 is indexing-fed by the first indexing feed means 6, and the first microscope may be used to confirm whether or not the first condenser 31 that has been indexing-fed is accurately positioned on a projected dicing line L to be processed.

The present invention is not limited to the embodiment described above, but many changes, replacements, and modifications may be made without departing from the scope of the present invention. Furthermore, the present invention may be reduced to practice according to other techniques, processes, schemes, plans, or arrangements insofar as they are capable of implementing the principles of the present invention owing to technological advances or derivations. Therefore, the scope of the appended claims should be interpreted as covering all the embodiments falling within the range of the technical idea of the present invention.

As described above, the present invention is advantageous in that it can shorten a standby time for a higher processing efficiency, and is particularly useful when applied to a laser processing apparatus and a laser processing method for processing a wafer by applying a laser beam to the wafer along a grid of projected dicing lines on the wafer.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus configured to process a wafer with a laser beam which is applied to the wafer along a plurality of projected dicing lines on a surface of the wafer, the projected dicing lines demarcating the surface into a plurality of areas with devices formed in the areas, comprising:
a holding table having a holding surface configured to hold the wafer thereon;
processing means for processing the wafer held on the holding table with the laser beam which is focused at a processing point along the projected dicing lines; and
X-moving means for moving said holding table in X-directions which are directions along which the projected dicing lines extend; wherein
said processing means includes:
a laser oscillator configured to oscillate the laser beam;
a first condenser and a second condenser juxtaposed in Y directions perpendicular to said X directions over said holding surface and disposed in order of arrival of the laser beam from said laser oscillator; and
switching means disposed on the optical path of the laser beam from said laser oscillator in the Y directions and arranged to switch between a mode configured to focus the laser beam from said laser oscillator with said first condenser and a mode configured to focus the laser beam from said laser oscillator with said second condenser,
said switching means includes:
a ½ wavelength plate;
rotating means for turning said ½ wavelength plate selectively to a first angle and a second angle;
a polarizing beam splitter configured to reflect 100% an S-polarized laser beam whose plane of polarization has been rotated by said ½ wavelength plate that has been turned to the first angle and whose optical path extends along the Y directions, to travel along an optical path in Z directions perpendicular to the X directions and the Y directions to said first condenser, so that said S-polarized laser beam is focused by said first condenser; and
a mirror configured to reflect a P-polarized laser beam which has been transmitted 100% through said polarizing beam splitter, and whose plane of polarization has been rotated by said ½ wavelength plate that has been turned to the second angle and whose optical path extends along the Y directions, to travel along an optical path in the Z directions to said second condenser, so that said P-polarized laser beam is focused by said second condenser;
said laser processing apparatus further includes:
first indexing feed means for indexing-feeding said polarizing beam splitter and said first condenser in one of the Y directions;
second indexing feed means for indexing-feeding said mirror and said second condenser in one of the Y directions; and
control means; and
while said wafer is being processed with the laser beam from either one of said first condenser and said second condenser, said control means operates one of said first indexing feed means and said second indexing feed means to indexing-feed the other of said first condenser and said second condenser to a next one of the projected dicing lines to be processed.

2. A laser processing method of processing a wafer with a laser beam using the laser processing apparatus according to claim 1, comprising:
a holding step of holding the wafer with the projected dicing lines on a holding table;
an alignment step of detecting the projected dicing lines on the wafer held in said holding step;
a first processing step of positioning a processing point of said first condenser which has focused the laser beam from said laser oscillator, on one of the projected dicing lines, and moving said holding table in a +X direction to process said wafer with the laser beam;
a first indexing feed step of positioning a processing point of said second condenser on a next one of the projected dicing line to be processed during said first processing step;
after said first indexing feed step, a second processing step of moving said holding table in a −X direction which is opposite to the +X direction in said first processing step to process said wafer with the laser beam at the processing point of said second condenser;
a second indexing feed step of positioning the processing point of said first condenser on a next one of the projected dicing line to be processed during said second processing step; and
a repeating step of repeating said first processing step, said first indexing feed step, said second processing step, and said second indexing feed step.

* * * * *